United States Patent [19]
Williams et al.

[11] Patent Number: 5,998,834
[45] Date of Patent: *Dec. 7, 1999

[54] LONG CHANNEL TRENCH-GATED POWER MOSFET HAVING FULLY DEPLETED BODY REGION

[75] Inventors: Richard K. Williams, Cupertino; Brian H. Floyd, Sunnyvale; Wayne Grabowski, Mountain View; Mohamed Darwish, Saratoga; Mike F. Chang, Cupertino, all of Calif.

[73] Assignee: Siliconix Incorporated, Santa Clara, Calif.

[*] Notice: This patent issued on a continued prosecution application filed under 37 CFR 1.53(d), and is subject to the twenty year patent term provisions of 35 U.S.C. 154(a)(2).

[21] Appl. No.: 08/651,232

[22] Filed: May 22, 1996

[51] Int. Cl.$^6$ .............................. H01L 29/76; H01L 29/94; H01L 31/062
[52] U.S. Cl. .......................... 257/330; 257/331; 257/334
[58] Field of Search ...................... 257/330, 331, 257/332, 334, 341, 401

[56] References Cited

U.S. PATENT DOCUMENTS

| 5,405,794 | 4/1995 | Kim ......................................... 257/332 |
| 5,592,005 | 1/1997 | Floyd et al. ............................. 257/331 |

*Primary Examiner*—Wael M. Fahmy
*Attorney, Agent, or Firm*—Skjerven, Morrill, MacPherson, Franklin & Friel LLP; David E. Steuber

[57] ABSTRACT

A trenched-gate power MOSFET includes a body region that is formed within a mesa between adjacent gate trenches. The doping concentration of the body region is established such that the body region does not fully deplete at normal drain voltages. The MOSFET also includes a gate which is doped with material of a conductivity type opposite to that of the body. The width of the mesa and the doping concentration of the body region and gate are established such that the body region is fully depleted by the combined effects of the source-body and drain body junctions and the gate. As a result, the conventional source-body short can be eliminated, providing a greater cell packing density and lower on-resistance while maintaining acceptable levels of leakage current when the MOSFET is in the off-state.

7 Claims, 10 Drawing Sheets

5,998,834

1

LONG CHANNEL TRENCH-GATED POWER MOSFET HAVING FULLY DEPLETED BODY REGION

FIELD OF THE INVENTION

This invention relates to metal-oxide-silicon field-effect transistors (MOSFETs) and in particular to a type of power MOSFET in which the gate is formed in a trench.

BACKGROUND OF THE INVENTION

The primary performance objective for a power MOSFET switch is the achievement of the lowest possible on-resistance for a given breakdown voltage rating. The breakdown voltage is a measure of the ability of the MOSFET to withstand voltage when it is turned off, and the on-resistance is a measure of the ability of the MOSFET to carry a current with a minimal loss of power when it is turned on. The on-resistance is defined as the ratio of drain-to-source voltage to drain current when the switch is turned on.

Structurally, power MOSFETs fall into two main categories. In lateral MOSFETs, the current flow is primarily "lateral" between source and drain regions that are formed at the surface of the substrate. In vertical MOSFETs, the current flow is primarily "vertical" between a source region located at the top surface of the substrate and a drain region located adjacent the backside of the substrate. In one subcategory of vertical MOSFETs, the gate is formed in a trench which extends into the top surface of the substrate. A trench-gated MOSFET is exemplified in the cross-sectional view of FIG. 1, which shows a MOSFET 10 having an N+ source region 11, a drain region 12 which includes an N++ substrate 13 and an N-epitaxial (epi) layer 14, and a P-body region 15. Current flows between source region 11 and drain region 12 through a channel in P-body region 15 adjacent the side wall of trenched gate 16. Viewed from above, the trench appears as a pattern which divides the MOSFET into geometric cells. The cells may be rectangular, square, hexagonal or some other shape. A planar double-diffused MOSFET is exemplified by MOSFET 20 shown in FIG. 2, having an N+ source region 21, a drain region 22 which includes an N++ substrate 23 and an N-epi layer 24, and a P-body region 25. Current flows between source region 21 and drain region 22 through a channel in P-body region 25 directly under a gate 26.

In both of MOSFETs 10 and 20 the body regions (15,25) are normally biased to a fixed potential. In particular, metal layers 17,27 short the body regions to the source regions (11,21) through P+ body contact regions 18,28. Body regions 15,25 are doped with P-type ions to the point that neither body region becomes completely depleted, even at high drain-to-source or gate-to-drain potentials. Because the body regions are not depleted and are always shorted to the source regions, the voltage applied to MOSFETs 10,20 when they are turned off appears across the drain-to-body junction. A depletion region forms around the drain-to-body junction, mostly on the more lightly doped drain side of the junction.

FIG. 3A is a view of a portion of MOSFET 10 along cross-section III—III shown in FIG. 1, and FIG. 3B shows a profile of the dopant concentration along cross-section III—III at a drain voltage of zero. The depletion regions surrounding the source-to-body junction S/B and the drain-to-body junction D/B are shown in FIG. 3B. The corresponding energy bands are shown in FIG. 3C, which displays a conduction band $E_c$, a valence band $E_v$, and an intrinsic level $E_i$, along with the Fermi level $E_f$ in equilibrium. The source-to-body junction creates a built-in energy barrier which prevents electrons from flowing from the source to the drain. FIG. 3D is a similar energy band diagram which shows only the conduction band $E_c$. The energy barrier between the source and body is clearly evident. Finally, FIG. 3E shows the changes in the conduction band as the voltage at the drain is progressively raised to a level $V_{D1}>0$ and then to a level $V_{D2}>V_{D1}$. Since the body region is not fully depleted, as shown in FIG. 3B, the application of a reverse bias between the drain and body does not lower the source-body barrier height. Thus MOSFET 10 avoids a punchthrough condition (where the depletion regions around the source-body and drain-body junctions meet) by preventing its body region from becoming completely depleted and maintaining its built-in source-to-body energy barrier at all levels of the drain voltage. This property is characteristic of a long-channel MOSFET.

As shown in the equivalent circuit diagram of FIG. 4, because the source and body regions of MOSFET 10 are shorted together, the PN diode represented by the drain-to-body junction appears "anti-parallel", i.e., parallel to the normal path of current through MOSFET 10 (from the drain to the source) but opposite in direction. The disadvantage of having the source-body short in MOSFET 10 is a loss of bidirectional current blocking capability and in some applications unwanted PN diode conduction, which can lead to charge storage near the drain-body junction, large reverse recovery times, ringing, etc. FIG. 4 shows that a parasitic bipolar transistor also resides within MOSFET 10, having a base region represented by the undepleted body region of the MOSFET. Unless precautions are taken, this parasitic bipolar transistor can produce undesirable operating conditions.

Despite these disadvantages, the source-to-body short is generally needed in conventional MOSFETs for several reasons. First and foremost, the body region must have a well-defined potential in order to prevent the threshold voltage of the MOSFET from drifting upward and downward uncontrollably. For example, if the source-body junction were to become reverse-biased, as a result of the well-known "body effect" the threshold voltage of the device would tend to increase. Second, the source-body short is needed to prevent snapback in the parasitic bipolar transistor, an undesirable phenomenon which leads to a substantial reduction of the off-state breakdown voltage of the device (referred to as $BV_{ceo}$ breakdown in bipolar transistors). This problem is especially acute for MOSFETs having design breakdown voltages over 30 V, since the snapback voltage of the parasitic bipolar transistor may be only 10 or 20 V. Operating at 500 V and snapping back to 20 V, for example, would lead to destructive currents in the device.

A major disadvantage of having an integral source-body short is that it must be included in every vertical MOSFET cell, thereby wasting valuable area and requiring a larger cell pitch. A larger cell pitch results in fewer cells and a lower total gate width per unit area, which in turn increases the on-resistance of the MOSFET. For example, as shown in FIGS. 5A and 5B, the minimum width of the source-body short region for a planar DMOSFET and a trenched-gate MOSFET, respectively, is about 4 μm. In the planar DMOSFET, where the length of the gate is limited to at least around 4 μm, this implies a minimum cell pitch of 8 μm, and even in the trenched-gate MOSFET the source-body short limits the cell pitch to about 5 μm.

Two types of trenched-gate MOSFETs have been proposed to eliminate the need for a source-body short. One type, known as an accumulation mode FET or ACCUFET, is shown in cross-section in FIG. 6. ACCUFET 60 is a trenched-gate device which uses a semiconductor material of a single conductivity type but in different doping concentrations. Its gate is doped with P-type material such that the lightly-doped N-region 61 is fully depleted when the gate is turned off. Accordingly, the ACCUFET's leakage characteristic is that of a device which relies on an electrically induced potential barrier created by the gate rather than the built-in voltage of a PN junction.

FIG. 7A shows a portion of ACCUFET 60 taken at cross-section VII—VII in FIG. 6. FIGS. 7B and 7C show the doping concentration profile and energy bands, respectively, at cross-section VII—VII. The influence of the gate in forming an energy barrier is evident from FIG. 7C, where the intrinsic level $E_i$ in the lightly doped region 61 is below the Fermi level (i.e., N-type) without the assistance of the gate but crosses the Fermi level (acting like an electrically-induced P-type region) when the gate is driven high. FIG. 7D shows that the energy barrier is almost immediately lowered by the application of any drain-to-source bias $V_D$. The ACCUFET is further described in application Ser. No. 08/459,054, filed Jun. 2, 1995.

The second type of device, sometimes referred to as a punchthrough FET or PT-FET, is illustrated in cross-section in FIG. 8. PT-FET 80 includes a P-body region 81 which is of opposite conductivity type to its N+ source region 82 and N+ drain region 83. Unlike a conventional MOSFET, however, the gate 84 is doped with P-type material, and the "mesa" between the gate trenches is made narrow. Moreover, the doping of P-body region 81 is so light that any small amount of drain voltage $V_D$ fully depletes the body region. This is evident from FIGS. 9B and 9C, which show the doping profile at cross-section IX—IX in FIG. 8 when $V_D$ equals 0 V and 0.1–1.0 V, respectively. Note from FIG. 9B that only a small portion of the body region 81 remains undepleted at $V_D$=0 V and, as shown in FIG. 9C, the body region is fully depleted when $V_D$=0.1–1.0 V. Since the body region is fully depleted, it does not float, and no external body bias is required to define and stabilize the threshold voltage. There is no "quasi neutral" region in the P-body in which to apply an externally defined body bias. In this way the problem of threshold voltage drift is avoided.

In its off-state, then, the PT-FET relies on the effect of the P-type gate on the P-type body material in the narrow mesa between the gate trenches to increase the height of the energy barrier between the source and body regions and thereby minimize its leakage current. The gate does not materially affect the depletion of the P-body region. Depletion spreading in the P-body region occurs almost entirely as a result of the PN junctions between the body region and the source and drain regions, respectively.

As shown in FIG. 9D, however, the fact that the body region is fully depleted at small levels of $V_D$ means that, despite the P-type gate and narrow mesa, drain-induced barrier lowering (DIBL) occurs at small levels of $V_D$. DIBL gives rise to a diffusion current which has a maximum limit determined by the charge carrier velocity. Thus in some situations the PT-FET may suffer from an unacceptably high leakage current.

The PT-FET is further described in application Ser. No. 08/415,009, filed Mar. 31, 1995, now U.S. Pat. No. 5,592,005, issued Jan. 7,1997.

SUMMARY OF THE INVENTION

The MOSFET of this invention is a vertical trenched-gate device which includes source and drain regions of a first conductivity type and an intervening body region of a second conductivity type. The gate is formed in trenches, and the source and body regions are formed in "mesas" between the gate trenches.

The doping concentration and profile and the vertical dimension of the body region (i.e., the distance between the source-body junction and the drain-body junction) are established such that, absent the effect of the gate, the body region does not become fully depleted at normal levels of source-drain voltage $V_{DS}$ and, in the preferred embodiment, at any voltage less than a $V_{DS}$ which causes junction avalanche breakdown to occur in the device.

Furthermore, the gate is doped with material of the first conductivity type. The doping concentration and profile of the body and the horizontal dimension of the body region (i.e., the width of the mesa) are established such that the body region does become depleted from the combined effects of the source-body and drain-body junctions and the gate when the gate is biased at the same potential as the source (the "source" for this purpose being defined as the more negative of the source/drain terminals in an N-channel MOSFET and the more positive of the source/drain terminals in a P-channel MOSFET).

The MOSFET of this invention generally has a off-state leakage current which is lower than that of either an ACCUFET or an PT-FET, and it defaults to a normally "off" device in the absence of a defined gate potential. Without the influence of the gate, the MOSFET behaves like an "off" open base bipolar transistor. On the other hand, since the body region is depleted under the influence of the gate, the MOSFET of this invention requires no source-to-body short and therefore can be fabricated with a greater cell packing density than would otherwise be possible.

DESCRIPTION OF THE INVENTION

Figure 2:
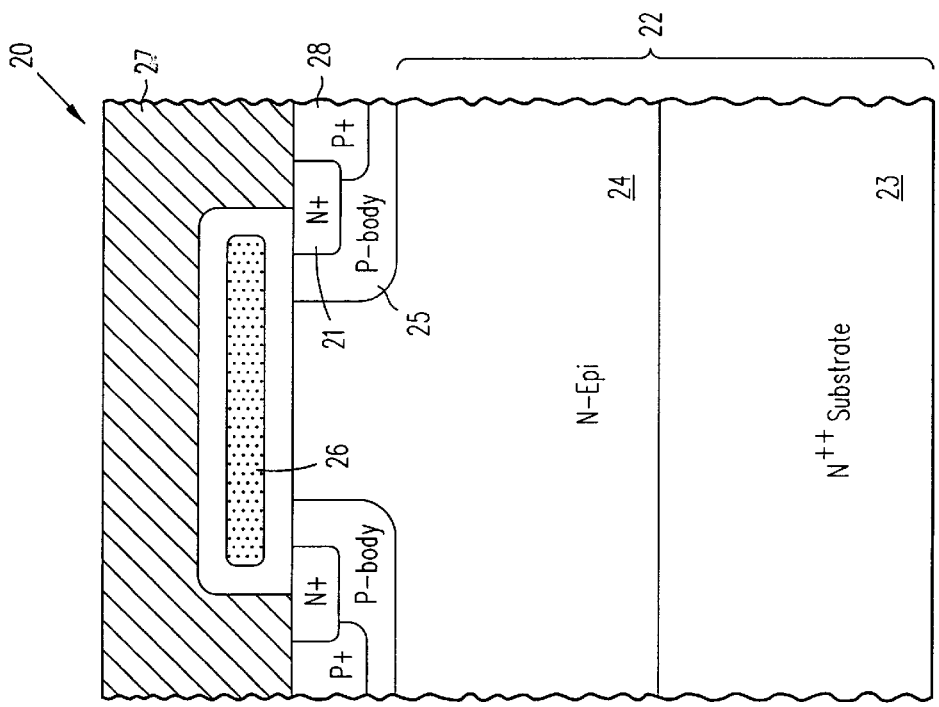
FIG. 2 illustrates a cross-sectional view of a conventional planar double-diffused vertical MOSFET.
Figure 1:
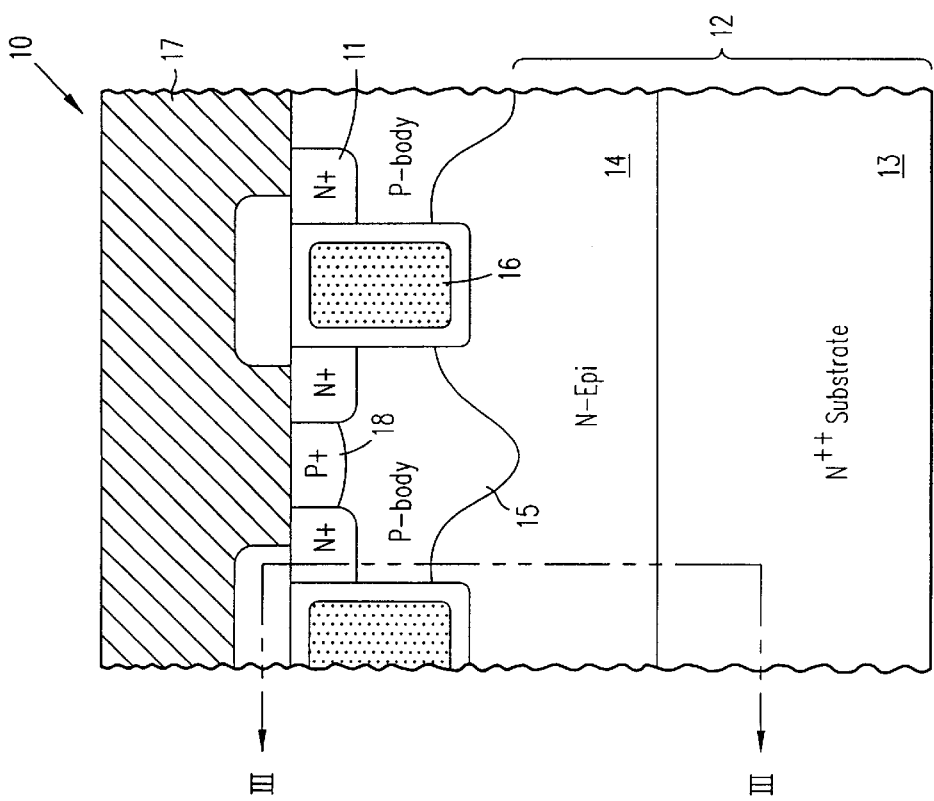
FIG. 1 illustrates a cross-sectional view of a conventional trenched-gate MOSFET.
Figure 3A:
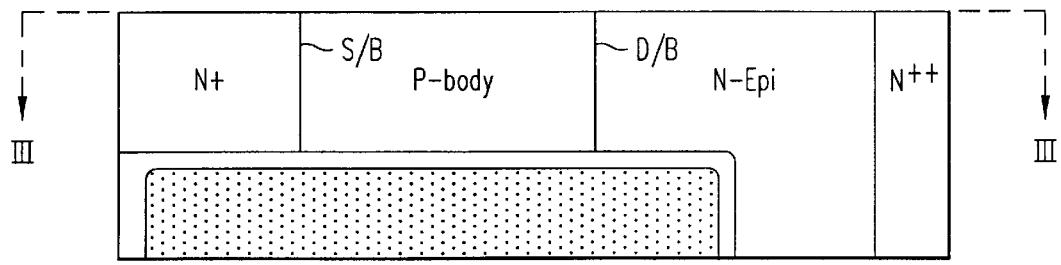
FIG. 3A illustrates a portion of the MOSFET of FIG. 1 taken at cross-section III—III.
Figure 3B:
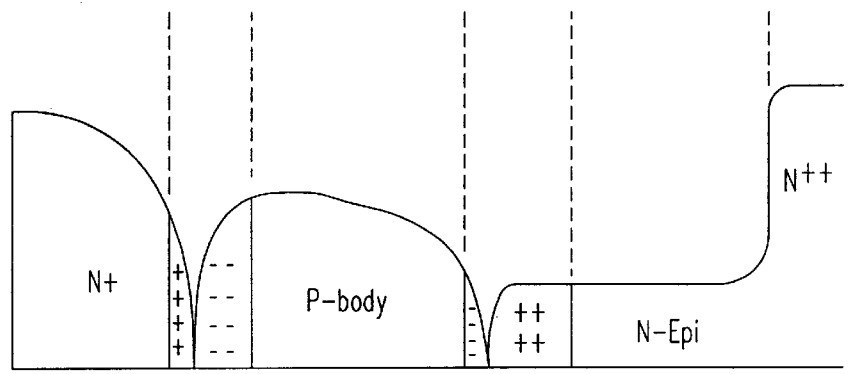
FIG. 3B illustrates a graph showing the dopant concentration profile of the MOSFET of FIG. 1.
Figure 3C:
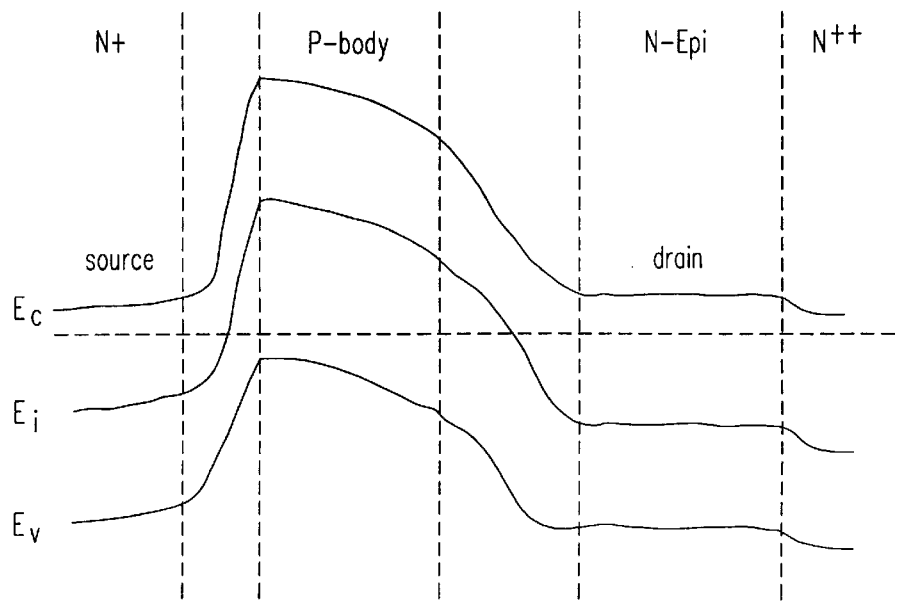
FIG. 3C illustrates a graph showing the energy bands of the MOSFET of FIG. 1.
Figure 3D:
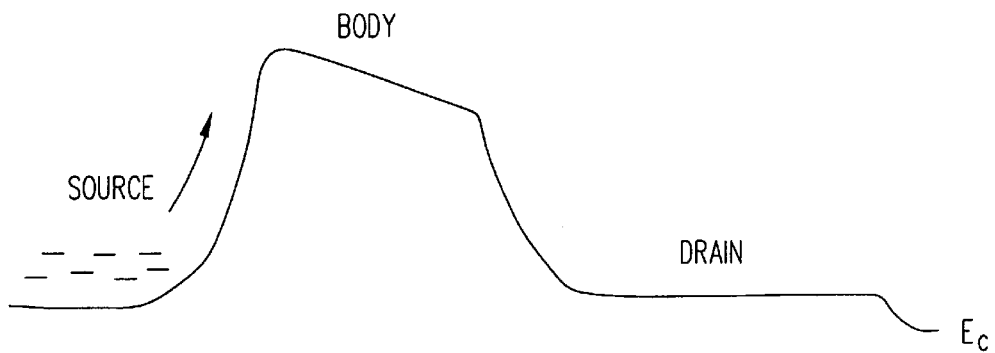
FIG. 3D illustrates a graph showing the conduction band of the MOSFET of FIG. 1 at zero drain voltage.
Figure 3E:
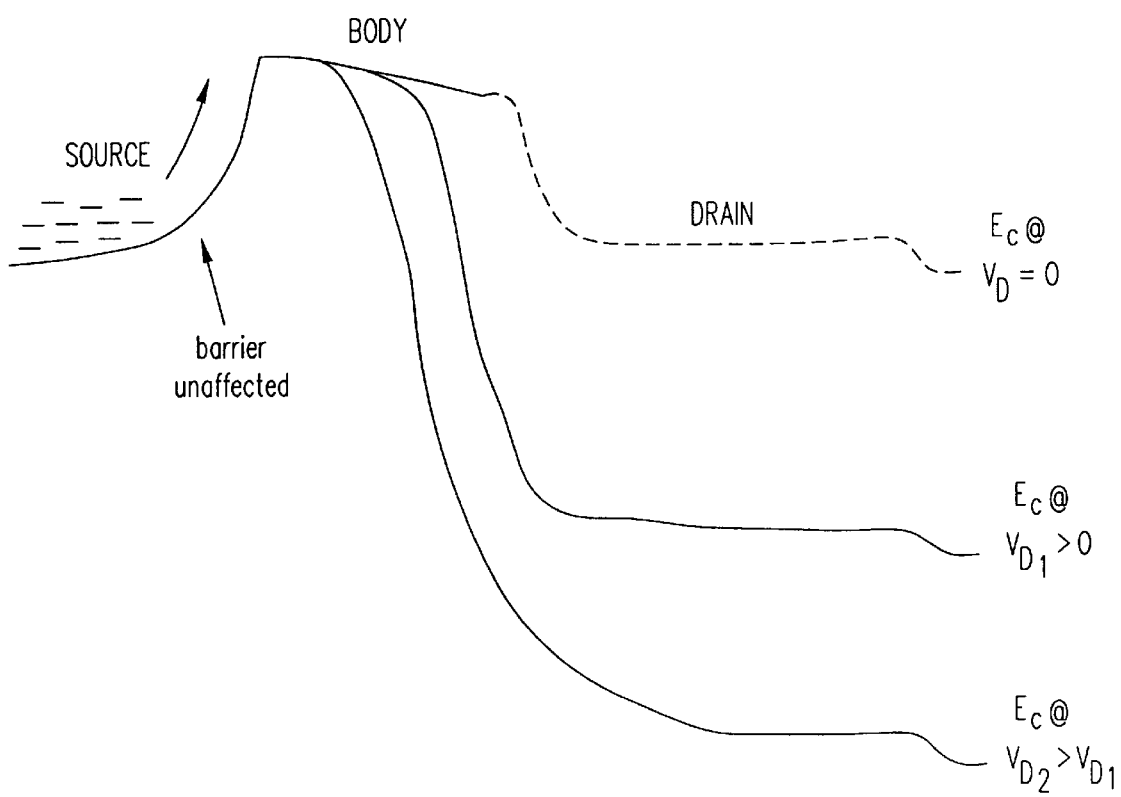
FIG. 3E illustrates a graph showing the conduction band of the MOSFET of FIG. 1 at progressively increasing levels of drain voltage.
Figure 4:
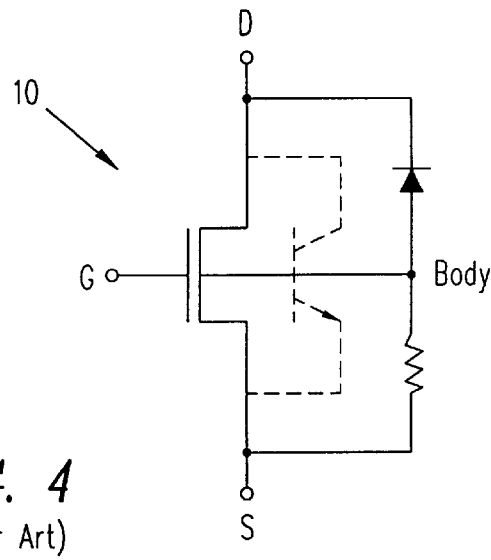
FIG. 4 illustrates a schematic diagram of a conventional MOSFET having a source-body short.
Figure 6:
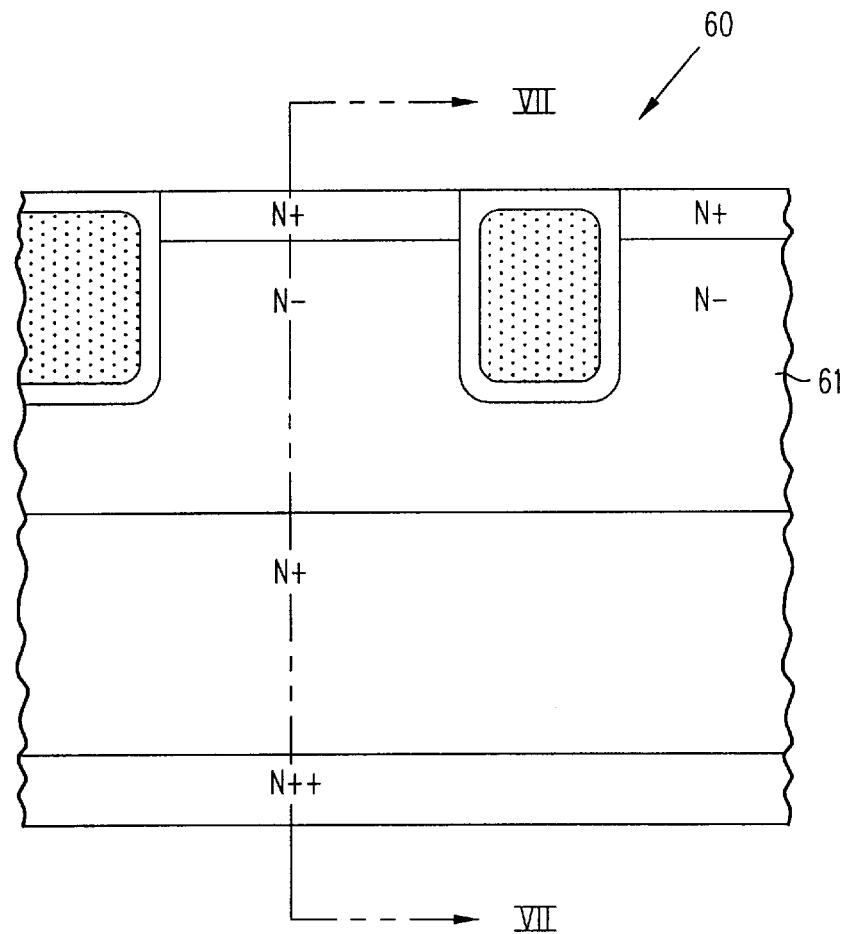
FIG. 6 illustrates a cross-sectional view of an accumulation mode MOSFET.
Figure 5A:
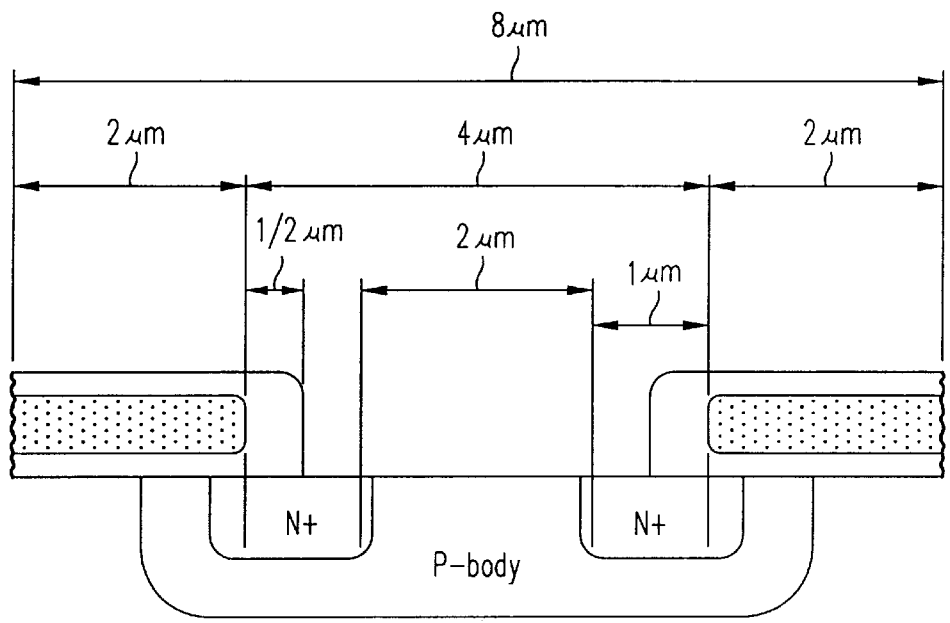
FIGS. 5A and 5B illustrate cross-sectional views of a planar double-diffused and trenched-gate MOSFET, respectively, showing the area required for the source-body short.
Figure 5B:
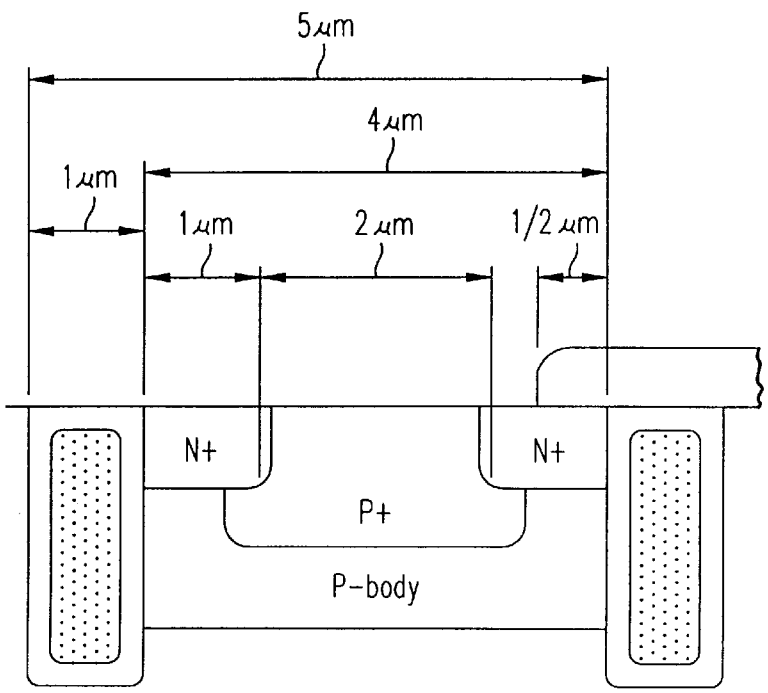
Figure 7A:
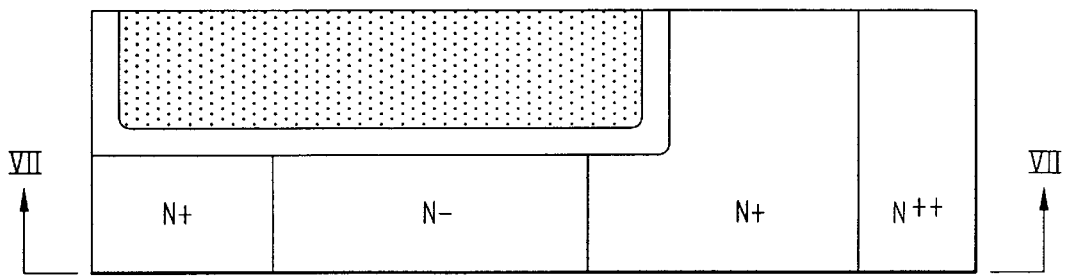
FIG. 7A illustrates a portion of the MOSFET of FIG. 6 taken at cross-section VII—VII.
Figure 7B:
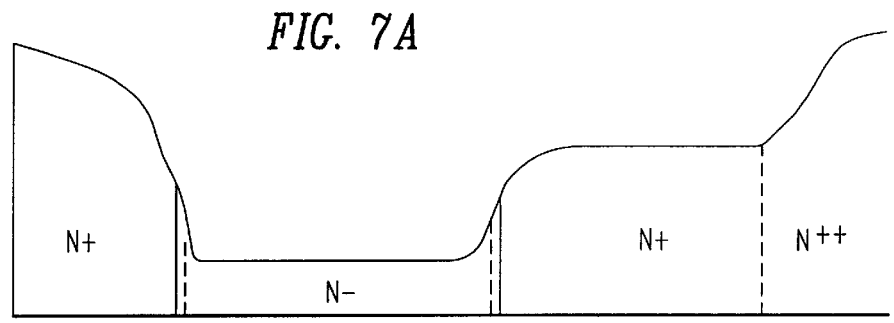
FIG. 7B illustrates a graph showing the dopant concentration profile of the MOSFET of FIG. 6.
Figure 7C:
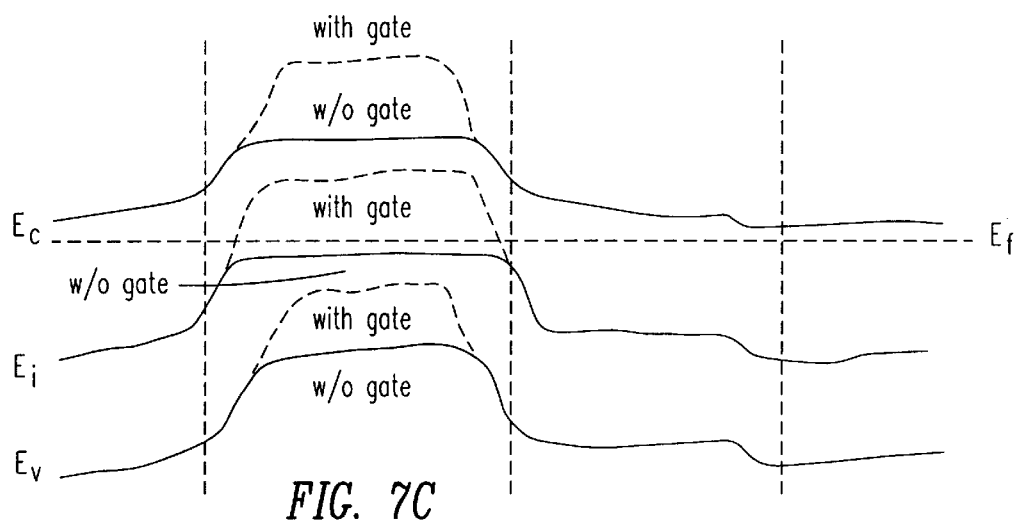
FIG. 7C illustrates a graph showing the energy bands of the MOSFET of FIG. 6 with and without gate drive.
Figure 7D:
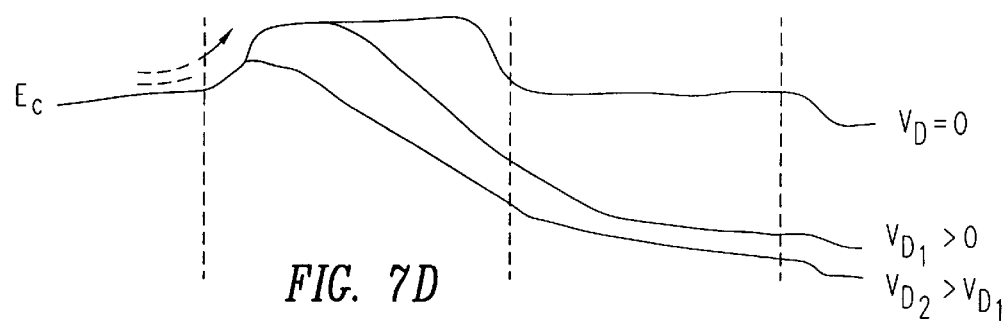
FIG. 7D illustrates a graph showing the conduction band of the MOSFET of FIG. 6 at progressively increasing levels of drain voltage.
Figure 8:
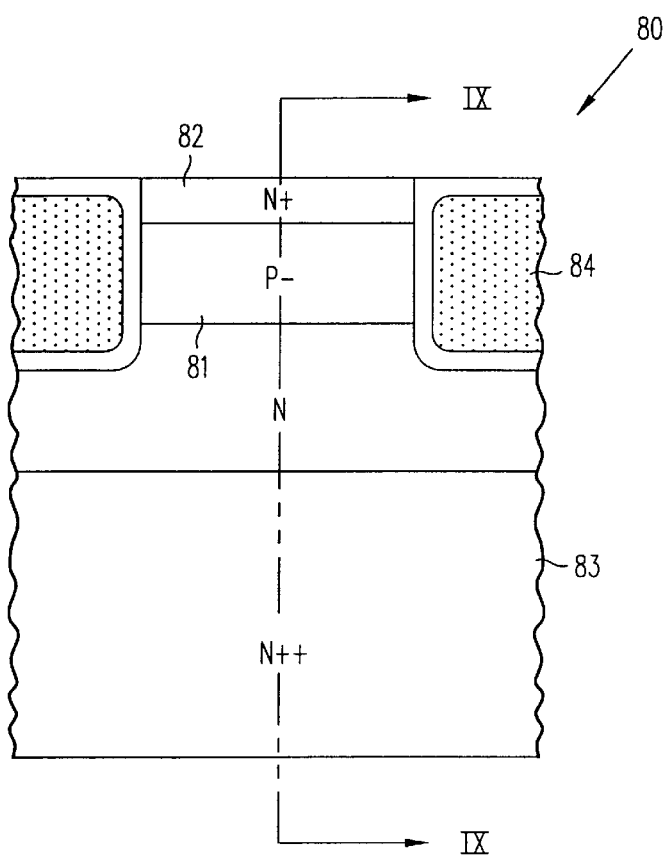
FIG. 8 illustrates a cross-sectional view of a punch-through MOSFET.
Figure 9D:
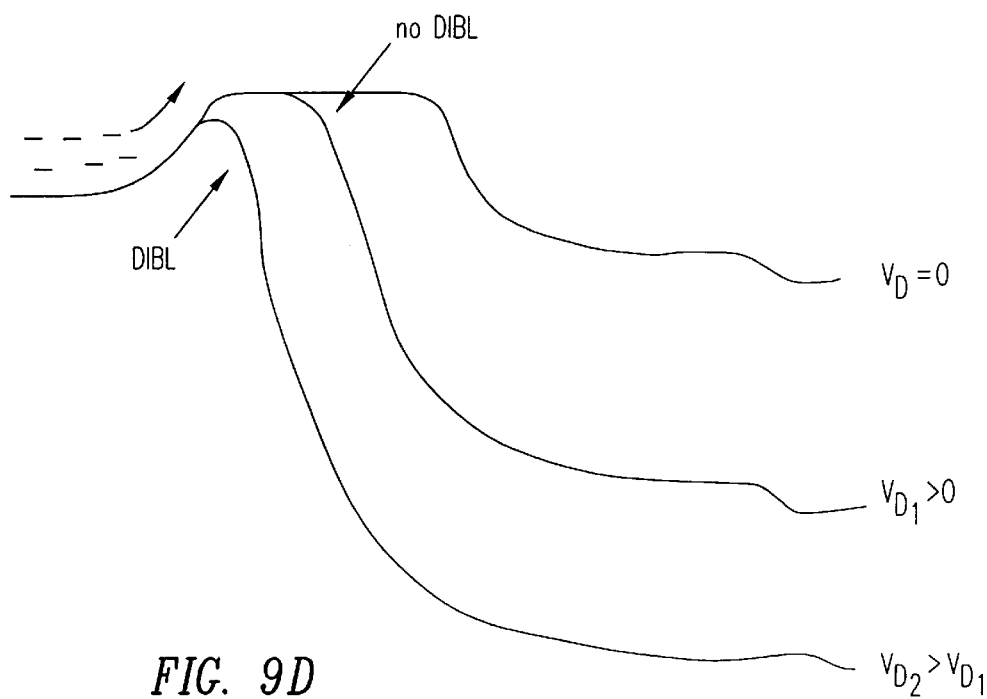
FIG. 9D illustrates a graph showing the conduction band of the MOSFET of FIG. 8 at progressively increasing levels of drain voltage.
Figure 9A:
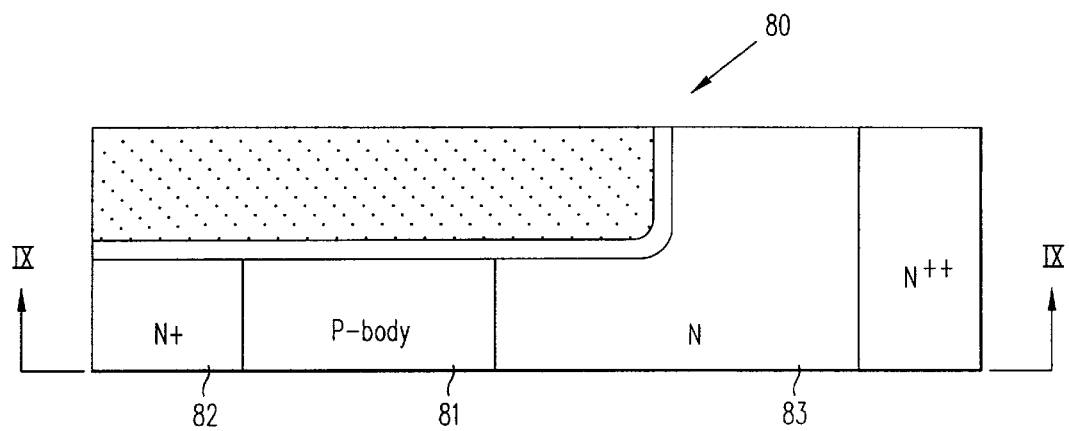
FIG. 9A illustrates a portion of the MOSFET of FIG. 8 taken at cross-section IX—IX.
Figure 9B:
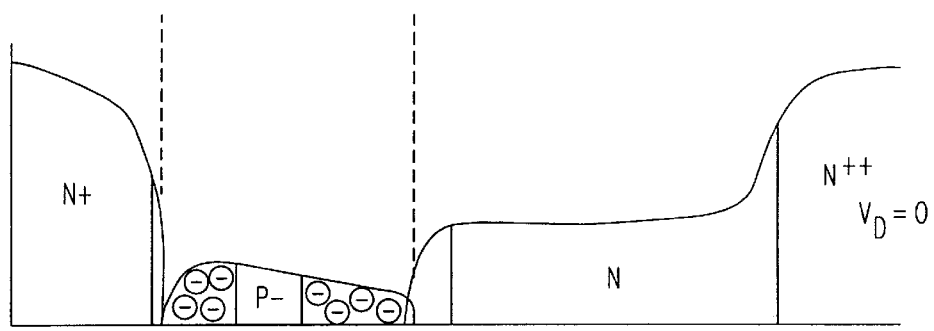
FIG. 9B illustrates a graph showing the dopant concentration profile and depletion regions of the MOSFET of FIG. 8 at a drain voltage of zero.
Figure 9C:
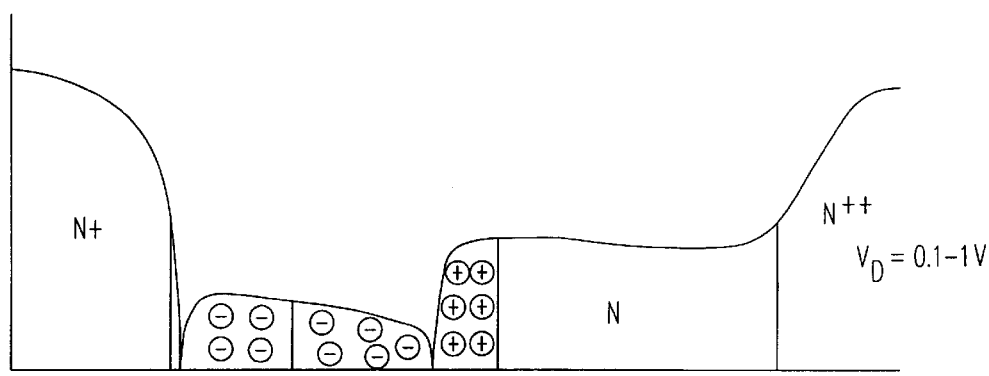
FIG. 9C illustrates a graph showing the dopant concentration profile and depletion regions of the MOSFET of FIG. 8 at a small drain voltage.
Figure 10:
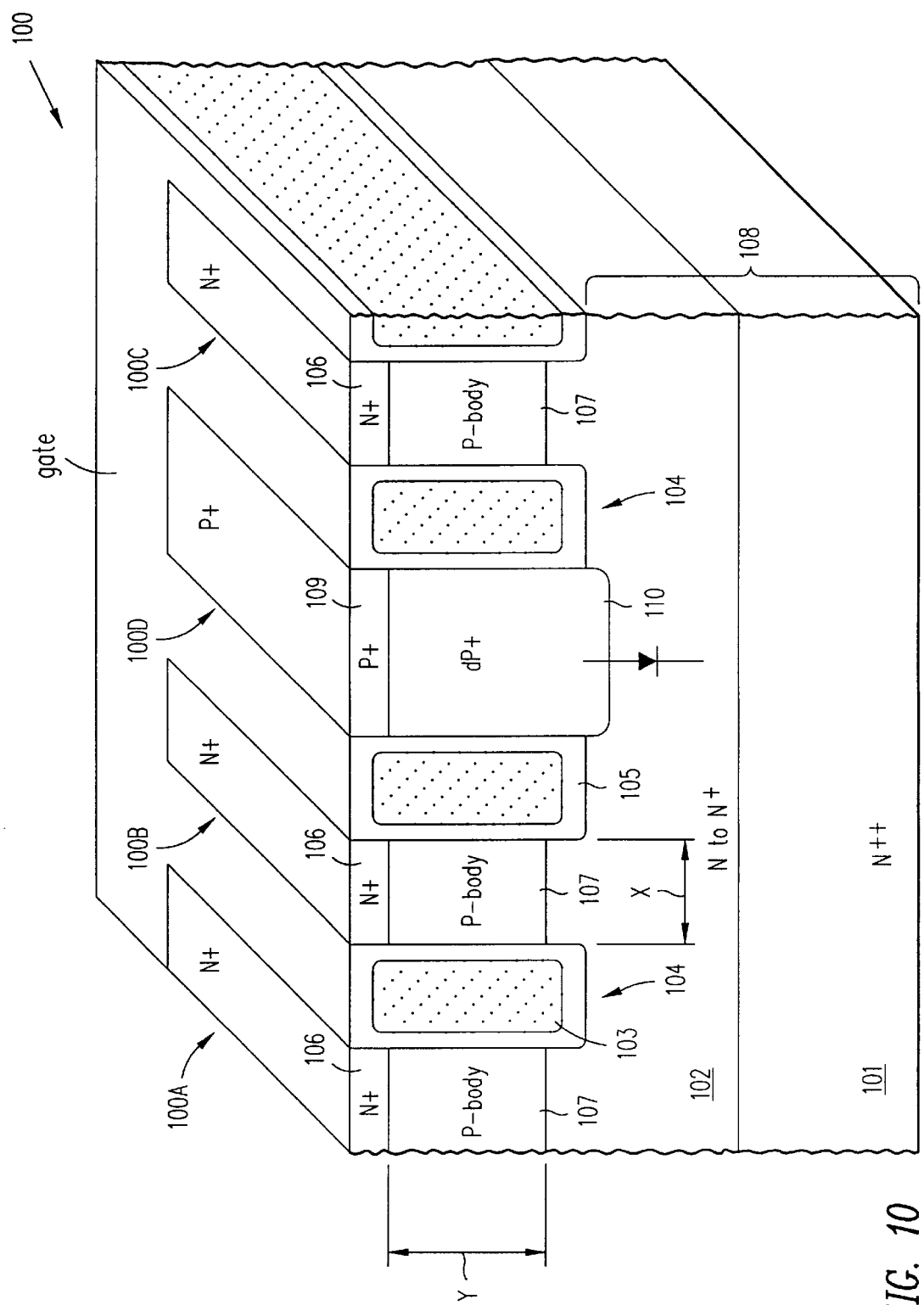
FIG. 10 illustrates a three-dimensional cross-sectional view of a long-channel MOSFET in accordance with this invention.

A three-dimensional cross-sectional view of a MOSFET 100 in accordance with this invention is shown in FIG. 10. MOSFET 100 is formed in a heavily-doped N++ substrate 101 which includes an N to N+ epitaxial (epi) layer 102. MOSFET 100 includes a gate 103 formed in a series of trenches 104 that extend downward from the top surface of the substrate 101 and are arrayed in a pattern of parallel stripes. The various arms of gate 103 are electrically connected together. Each arm of gate 103 is formed of polysilicon doped with N-type material and is separated from the semiconductor material of substrate 101 by an oxide layer 105. MOSFET 100 includes three active MOSFET cells 100A, 100B and 100C, along with a diode cell 100D which provides breakdown protection for active MOSFET cells 100A–100C and is described below.

Each of active MOSFET cells 100A–100C includes an N+ source region 106 and a P-body region 107. The N+ source regions of the cells are electrically connected together in a conventional manner, as are the P-body regions of the cells. Epi layer 102 along with substrate 101 form a drain region 108. MOSFET 100 is a long-channel MOSFET, which means that the P-body regions have a length Y which is typically greater than their width X.

Electrical contact is made to N+ source regions 106 by means of a metal contact (not shown). The contact can be formed using a mask or, preferably, by using a self-aligned contact process wherein the gate is protected curing contact etching, not by photoresist, but by a thick overlying oxide or nitride layer.

Figure 11:
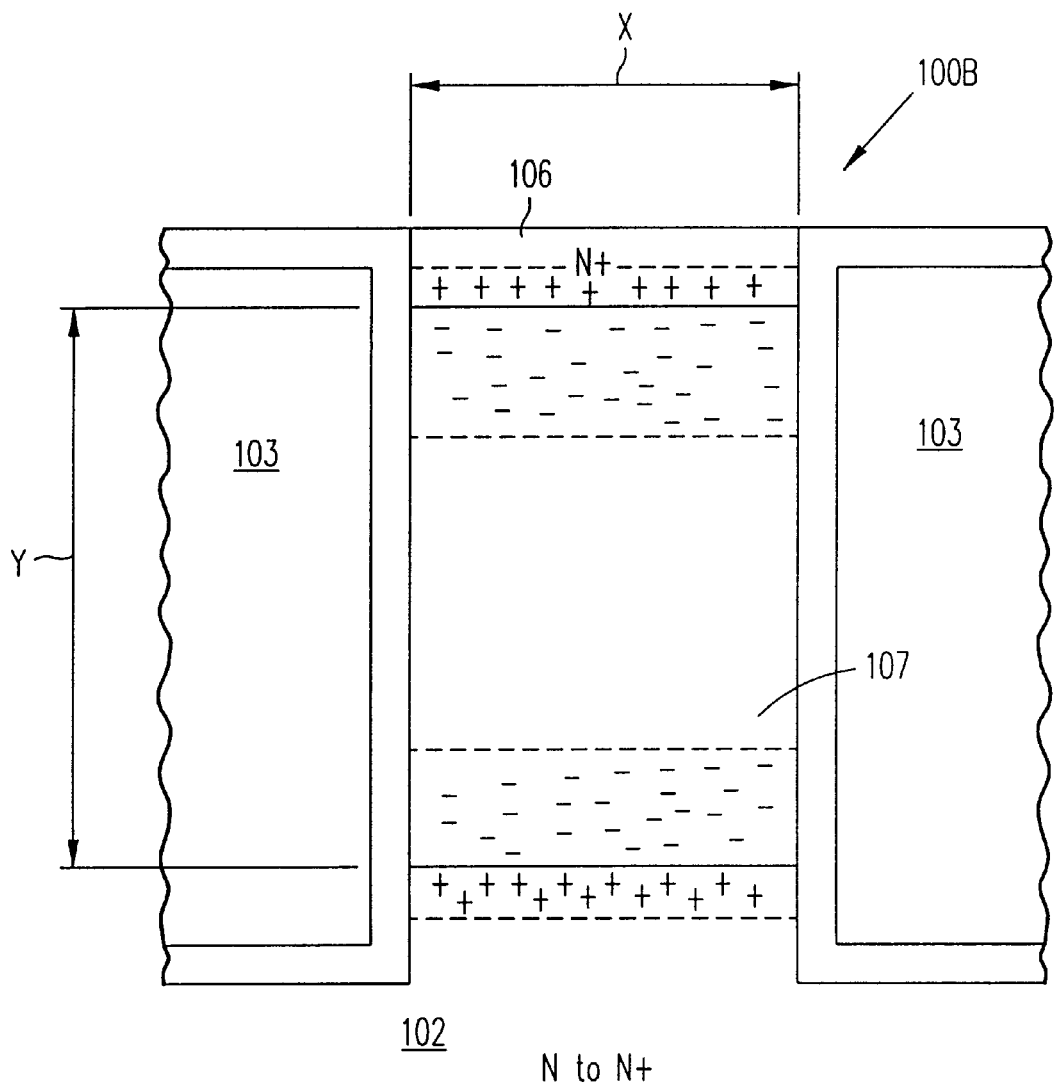
FIG. 11 is a detailed cross-sectional view of a single cell of the MOSFET shown in FIG. 10.

FIG. 11 illustrates a detailed view of active cell 100B, showing the depletion regions surrounding the PN junction between N+ source region 106 and P-body region 107 and the PN junction between drain region 108 and P-body region 107. As indicated, the length Y of P-body region 107 is established such that the depletion regions created by these two PN junctions alone do not occupy the whole of P-body region 107.

However, the width X of the P-body region 107 (which is also the width of the "mesa", between the adjacent arms of gate 103 shown in FIG. 11) is sufficiently narrow that effect of the gate 103, which is formed of N-doped polysilicon, when added to the effect of the PN junctions, effectively depletes the entirety of P-body region 107.

Diode cell 100D is described in application Ser. No. 08/459,555, filed Jun. 2, 1995, now abandoned, which is incorporated herein by reference in its entirety. Diode cell 100D contains a P+ contact region 109 and a deep P+ region 110. A PN junction between deep P+ region 110 and epi layer 102 forms a diode D1 which is connected in parallel with the channels of active cells 100A–100C. Deep P+ region 110 (diode D2) can serve several functions. It can limit the strength of the electric field and resulting carrier formation near the corners of the trench 32 and thereby eliminate the need for a deep central diffusion in active cells 100A–100C. It can clamp the drain voltage so as to protect the oxide layer 105 from overstress due to excessive electric fields and to prevent junction avalanche breakdown from occurring in the active cells 100A–100C. The breakdown voltage of diode D1 is set by properly adjusting the doping concentration in deep P+ region 110. Preferably, a diode cell is repeated at a specified periodicity throughout the cells of MOSFET 100 so that there is one diode cell for every N active cells.

Punchthrough is avoided in MOSFET 100 by satisfying certain minimum criteria for the body doping concentration. In a two-sided junction formed between the body region 107 and the drain region 108 of MOSFET 100, the charge per unit area is given as:

$$Q/A = qN_D X_{Dn} = qN_A X_{Dp} \qquad (1)$$

Assuming uniform doping in the two regions, the peak field at the junction is given by:

$$E_{max} = \frac{qN_D X_{Dn}}{\epsilon_{Si}} = \frac{qN_A X_{Dp}}{\epsilon_{Si}} \qquad (2)$$

With a voltage drop on each side of the junction $$V_p = \frac{1}{2} E_{max} X_{Dp} = \frac{Q_D/A}{2\epsilon_{Si}} X_{Dp} \qquad (3)$$

$$V_n = \frac{1}{2} E_{max} X_{Dn} = \frac{Q_D/A}{2\epsilon_{Si}} X_{Dn} \qquad (4)$$

which sums to the total voltage $$V_j = V_n + V_p = \frac{Q_D}{2\epsilon_{Si}} (X_{Dn} + X_{Dp}) \qquad (5)$$

with $Q'_D = Q_D/A$. Substituting $x_{Dn}$ from equation (1) to eliminate the drain depletion region yields $$V_j = V_n + V_p = \frac{Q_D}{2\epsilon_{Si}} \left( \frac{Q_D}{qN_D} + X_{Dp} \right) \qquad (6)$$

meaning that the minimum body charge to avoid punch-through can be found (approximately) by using the quadratic formula as a function of the desired voltage $V_j$ and the base width (channel length). While a longer channel results in more body charge, it undesirably increases the on-resistance, thereby limiting $x_{Dp}$ to the range of 0.5 to 1.5 $\mu$m in practical devices. Given a specific drain doping $N_D$ (e.g., between $1 \times 10^{17}$ and $2 \times 10^{19}$ cm$^{-3}$) the breakdown voltage of the protective diode D1 should be set slightly lower than the punchthrough voltage of the active cells 100A–100C by adjusting its anode concentration (i.e., the dopant concentration in deep P+ region 110).

To assure that the body region 107 is fully depleted at a gate-to-source voltage of zero volts, each of the two trenched gates surrounding a single mesa must each deplete 50% of the charge in the body region. Given a total charge $Q'_D$ in the body region and a depth $x_{Dp}$, the average concentration in the body region is $$N_B \approx Q_D/X_{Dp} \quad (7)$$

The lateral spreading and lateral charge depletion from only the gate are then $$Y_{Dp} \approx \sqrt{\frac{2\epsilon_{Si}}{qN_B}} \cdot \sqrt{\psi_s} \quad (8)$$

$$Q_{Bp}(\text{gate}) \approx 2\sqrt{q\epsilon_{Si}} \cdot \sqrt{N_B} \cdot \sqrt{\psi_s} \quad (9)$$

The depletion region extending laterally (in the y direction) only from the gate becomes fully depleted when $$Q_{Bp}(\text{gate}) \approx N_B \cdot \frac{Y_{Dp}}{2} \quad (10)$$

Preferably, if the mesa width is less than the trench width, a "stripe" cell geometry is used, and if the mesa width is greater than the trench width, a closed cell geometry is used.

With the punchthrough FET described in application Ser. No. 08/415,009, now U.S. Pat. No. 5,592,005, the energy barrier at the source-body junction has a low point near the center of the mesa, whereas with the MOSFET of this invention the energy barrier has a low point near the wall of the trench (i.e., the interface between the gate oxide and the silicon). Thus current leakage in a punchthrough FET occurs first near the center of the mesa, whereas with the MOSFET of this invention current leakage occurs first near the wall of the trench.

The principles of this invention can be combined with other features, such as the "1 of N" diode clamp taught in the above-referenced application Ser. No. 08/459,555, now abandoned. The MOSFET of this invention can also be used for bidirectional current blocking, where the source and drain are interchangeable, so long as the proper range of gate voltages is maintained by the controlling circuitry. The bidirectional diode clamp described in application Ser. No. 08/460,336, filed Jun. 2, 1995, now abandoned, incorporated herein by reference in its entirety, is also applicable to this invention.

The foregoing embodiments are intended to be illustrative and not limiting. Numerous additional embodiments in accordance with the principles of this invention will be apparent to those skilled in the art. The broad scope of this invention is limited only by the following claims.

We claim:

1. A trenched-gate power MOSFET comprising:
   a semiconductor substrate;
   a gate positioned in a trench, said trench extending into said substrate from a top surface thereof, said gate being doped with material of a first conductivity type;
   a source region of said first conductivity type adjacent said top surface;
   a body region of a second conductivity type opposite to said first conductivity type underlying said source region and forming a source-body junction with said source region;
   a drain region of said first conductivity type underlying said body region and forming a drain-body junction with said body region;
   wherein a doping concentration and profile of said body region and a distance between said source-body junction and said drain-body junction are such that, at normal levels of source-drain voltage to which the MOSFET is exposed, a combined effect of said source-body junction and said drain-body junction is insufficient to cause said body region to become depleted whereas a combined effect of said source-body junction, said drain-body junction and said gate is sufficient to cause said body region to be substantially depleted when said gate is biased at a voltage equal to a voltage at said source region.

2. The trenched-gate power MOSFET of claim 1 wherein said body region is formed in a mesa, said mesa being formed between said trench and a second trench, said second trench being located on an opposite side of said mesa from said trench.

3. The trenched-gate power MOSFET of claim 1 wherein said substrate comprises an epitaxial layer, said trench extending into said epitaxial layer.

4. The trenched-gate power MOSFET of claim 1 comprising a plurality of said trenches, said trenches being arrayed in a pattern of parallel stripes.

5. The trenched-gate power MOSFET of claim 1 wherein said trench comprises polysilicon.

6. The trenched-gate power MOSFET of claim 1 wherein said doping concentration and profile of said body region and said distance between said source-body junction and said drain-body junction are such that, at any source-drain voltage less than a source-drain voltage which causes junction avalanche breakdown to occur in said power MOSFET, a combined effect of said source-body junction and said drain-body junction is insufficient to cause said body region to become depleted whereas a combined effect of said source-body junction, said drain-body junction and said gate is sufficient to cause said body region to be substantially depleted when said gate is biased at a voltage equal to a voltage at said source region.

7. A trenched-gate power MOSFET comprising:
   a semiconductor substrate;
   a gate positioned in a trench, said trench extending into said substrate from a top surface thereof, said gate being doped with material of a first conductivity type;
   a source region of said first conductivity type adjacent said top surface;
   a body region of a second conductivity type opposite to said first conductivity type underlying said source region and forming a source-body junction with said source region;
   a drain region of said first conductivity type underlying said body region and forming a drain-body junction with said body region;
   wherein a combined effect of said source-body junction and said drain-body junction is insufficient to cause said body region to become depleted whereas a combined effect of said source-body junction, said drain-body junction and said gate is sufficient to cause said body region to be substantially depleted when said gate is biased at a voltage equal to a voltage at said source region and wherein a length of said body region measured between said source-body junction and said drain-body junction is greater than a width of said body region measured in a direction perpendicular to a direction of said length.

* * * * *